(12) United States Patent
Takaoka et al.

(10) Patent No.: US 7,018,683 B2
(45) Date of Patent: Mar. 28, 2006

(54) ELECTRON BEAM PROCESSING METHOD

(75) Inventors: Osamu Takaoka, Chiba (JP); Ryoji Hagiwara, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 0 days.

(21) Appl. No.: 10/867,865

(22) Filed: Jun. 15, 2004

(65) Prior Publication Data

US 2005/0276932 A1    Dec. 15, 2005

(51) Int. Cl.
*C23C 16/00* (2006.01)

(52) U.S. Cl. ............... 427/596; 427/248.1; 427/255.5; 438/401

(58) Field of Classification Search ............... 427/585, 427/8, 9, 10, 596, 140; 438/4, 975, 401; 216/94
See application file for complete search history.

(56) References Cited

U.S. PATENT DOCUMENTS 5,171,992 A * 12/1992 Clabes et al. ............... 250/306
6,706,609 B1 * 3/2004 Boulin et al. ............... 438/401

FOREIGN PATENT DOCUMENTS

JP             63305358           12/1988

* cited by examiner

*Primary Examiner*—Timothy Meeks
*Assistant Examiner*—Howard Abramowitz
(74) *Attorney, Agent, or Firm*—Adams & Wilks

(57) ABSTRACT

A microscopic projection or a characteristic pattern are formed in the vicinity of a region to be processed before processing using electron beam CVD, during processing an image of a region containing the projection or pattern formed by electron beam CVD is captured to obtain a current position of the projection or pattern, a difference between the position before staring and the current position is treated as a drift amount and processing is restarted at a region that has been subjected to microscopic adjustment of the electron irradiation region.

12 Claims, 2 Drawing Sheets

ELECTRON BEAM PROCESSING METHOD

BACKGROUND OF THE INVENTION

The present invention relates to high precision processing technology for a processing device for a microscopic region using an electron beam.

With respect to demands for high precision processing of microscopic regions of local domains that has increased in recent years, exemplified by semiconductor fine processing, magnetic storage devices and MEMS, since with an electron beam device such as a scanning electron microscope or a transmission electron microscope film deposition rate and etching rate are lowered even while indicating capability due to high image resolution, up to now focused ion beam devices having high film formation and etching rates have been used in high precision processing of microscopic regions.

However, with a focused ion beam device, since the extent of damage to a processed region having high film formation and etching rates due to ion beam injection is large, it is difficult to adapt to material that requires processing without damage, and for this type of material there is a demand for processing of microscopic regions using electron beam processing that causes hardly any damage.

With focused ion beam processing device of the related art, microscopic holes are formed close to a region to be processed, and during processing a region including the holes is scanned and secondary ions contained in a substrate film are detected to obtain an amount of movement of the opened holes. This movement amount is treated as a drift amount, and high precision processing is realized by performing microscopic adjustment of an ion beam irradiation region and repeated processing, and then repeatedly calculating drift amount and feeding back to the ion beam irradiation region. With processing using an electron beam, since film deposition rate and etching rate are slow, processing time becomes longer than with an ion beam processing device, and in order to achieve high processing accuracy it is necessary to reduce the effect of drift to less than that of a focused ion beam processing device.

Also, with a focused ion beam processing device, when carrying out drift correction such as described above, as well as the processing region, there is also damage in a scanning range used for the drift correction, and depending on the situation there may also be removal of material due to physical sputter effect. Also, if holes formed by an ion beam for drift correction are too small, the holes may be filled in during film deposition and etching making drift correction impossible and lowering processing accuracy, while if the holes formed are too large the holes cause lowering of processing quality.

The present invention implements processing of microscopic regions with no damage, high precision and high quality, by carrying out damage free drift correction with a microscopic region processing device using an electron beam.

SUMMARY OF THE INVENTION

A microscopic reference pattern is formed in the vicinity of a region of a sample to be processed using electron beam CVD. Before processing, a region containing the processed reference pattern is scanned by a focused electron beam to obtain a secondary electron image, and the position of the reference pattern is stored. During processing, a region containing the processed reference pattern is again scanned by a focused electron beam to detect the position of the reference pattern, and an amount of movement is obtained by comparison with the stored position before processing. This amount of movement is treated as a drift amount, microscopic adjustment of an electron beam irradiation region is carried out followed by re-processing, and after that processing is carried out by repeating interruption of processing, detection of the position of the reference pattern, calculation of the drift amount, and feedback to the electron beam irradiation region.

As a reference pattern, if a microscopic projection of at least 20 nm is formed so that drift amount can be measured with good accuracy, secondary electrons will often be ejected by the formed projection section due to an edge effect, which means that the position of this projection can be detected with high resolution.

If a material having a material contrast difference of at least a few percent from the material to be processed, in a secondary electron image, is formed by electron beam CVD in the vicinity of the region to be processed, since it is possible to easily detect the position of a formed film, even with a thin film, from this quality contrast difference, processing is carried out with drift correction during processing using the same method as for the projection described above. If this method is used, it is possible to make a marker for drift correction in a shorter time than in the case of the projection described above.

Naturally, calculation of drift amount for correcting the electron beam irradiation region at the time of processing does not have to compare position of a spot marker, and it is possible to form a characteristic microscopic pattern that can measure displacement in an X direction and a Y direction, such as a cross, instead of the spot marker, and to obtain the drift amount from pattern matching of a secondary electron image containing the characteristic microscopic pattern.

Since drift is corrected using an image obtained by scanning with an electron beam, there is no damage to a microscopic CVD film or the periphery thereof as there is with an ion beam. Because a deposition film is used as a marker for drift correction, there are no problems such as filling in of holes of a drift correction marker or dropping of accuracy due to holes being large, as with the related art technology. Also, since drift amount of a microscopic projection is obtained, drift correction can be carried out with high precision.

BRIEF DESCRIPTION OF THE DRAWINGS

FIG. 1A is a plan view and FIG. 1B is a cross sectional view.

DETAILED DESCRIPTION OF THE INVENTION

An example of the present invention adopted in photomask defect correction will be described in the following.

Figure 1A:
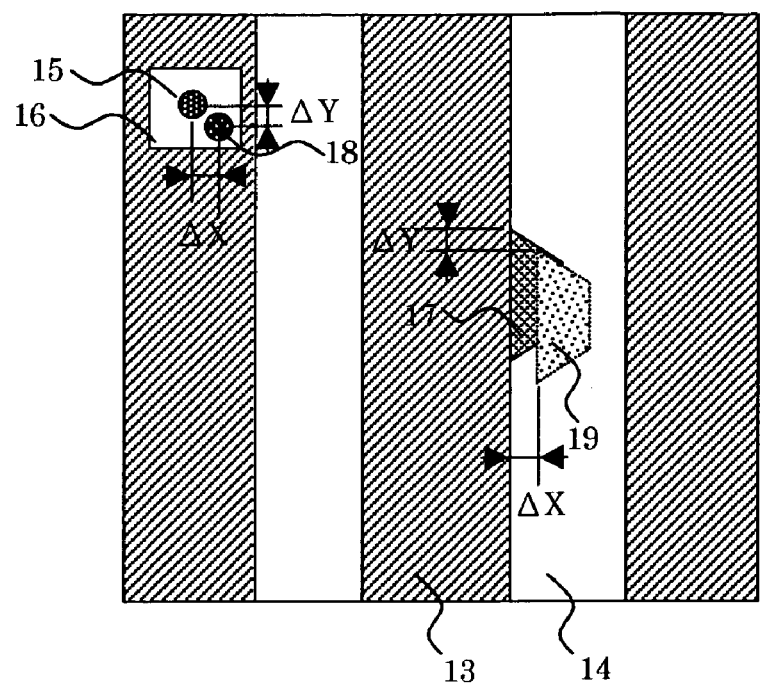
FIGS. 1A–1B are an explanatory drawing showing preferred characteristics of the present invention.
Figure 1B:
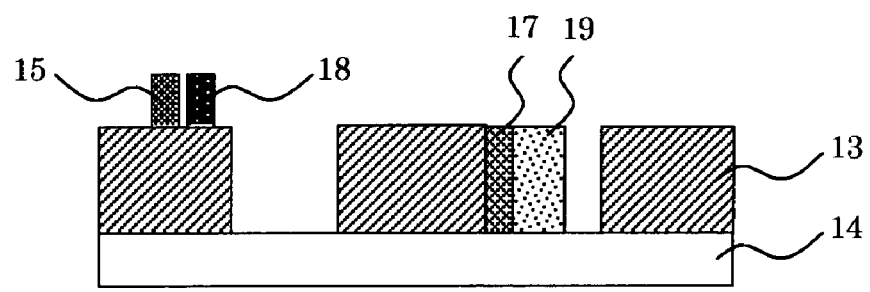
Figure 2:
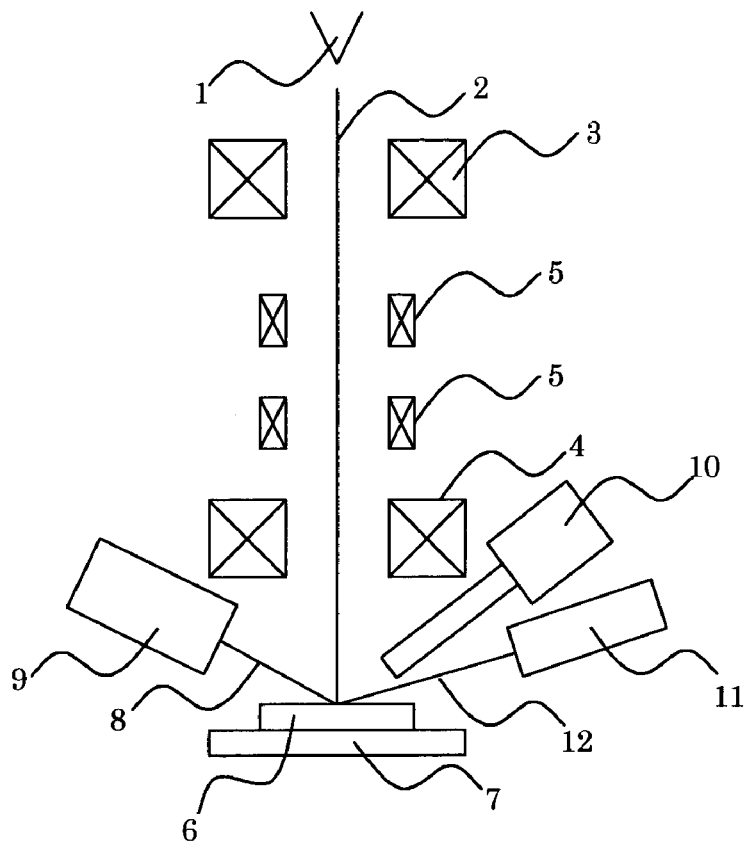
FIG. 2 is a schematic view of an electron beam processing device for describing an embodiment.

A sample in the form of a photomask 6 (binary mask or phase shift mask) containing defects is brought into a vacuum chamber of an electron beam device provided with a mechanism for introducing masking film source material gas or etching assist gas, as shown in FIG. 2, and an XY stage 7 is moved to defect positions detected by a defect inspection device. First of all, an electron beam 2 ejected from the field emission electron source (so called electron gun) 1 and accelerated to 500V–3 kV is focused by an electromagnetic condenser lens 3 and an electromagnetic objective lens 4, secondary electrons 8 generated when the electron beam 2 is scan-irradiated on the photomask 6 by an electromagnetic deflector 5 are captured by a secondary electron detector 9 in synchronism with the scanning period, the place where a microscopic projection is formed is determined from a secondary electron image, and a microscopic electron beam CVD film in the form of a projection 15 of at least 20 nm capable of measuring drift amount with good accuracy is formed, as shown in FIGS. 1A–1B. At the time of secondary electron image capture, the photomask has a conductive light shielding film pattern 13 deposited on a glass substrate 14, being an insulator, which means that it may not be possible to see a secondary electron image due to charging up as a result of accumulation of negative ions of the electron beam 2. It is, therefore, preferable to carry out monitoring in a state where a focused ion beam 12 is accelerated to a few 100V by a charge neutralization argon ion gun 11 and irradiated and charge neutralized. After completing formation of the projection 15 using electron beam CVD, a region 16 containing the projection 15 is scanned by the electron beam 2, the position of the projection is detected from a difference between secondary electron amounts of the projection and a substrate, and that position is stored. It is, therefore, preferable to carry out monitoring in a state where the argon ion beam 12 accelerated to a few 100V and focused by a charge neutralization argon ion gun 11 is irradiated, and charge neutralized.

Next, a secondary electron image of a region containing a defect is obtained and a defect correction region 17 (clear defect or opaque defect) is recognized. Only a region 17 identified as a clear defect or opaque defect is selectively scanned while masking film source material gas (for a clear defect) or etching gas (for an opaque defect) flows from a gas gun 10 for supply of masking film source material gas or etching assist gas, to carry out processing of the defect region 17. Processing is interrupted midway, and the microscopic region 16 centered on the projection position 15 stored before start of processing as the projection position is scanned by the electron beam 2, a projection position 18 is obtained from a secondary electron image and this position is stored. Processing is then restarted with differences $\Delta X$ and $\Delta Y$ from the position stored the time before treated as drift amount, using an electron beam irradiation region 19 to which offsets $\Delta Y$ and $\Delta Y$ have been applied that are the same as those applied to the electron beam irradiation region 17 at the time of processing. By repeating interruption of processing, projection position detection, calculation of drift amount from comparison with stored projection position, microscopic adjustment of processing region that has had drift altered, and restarting of processing, it is possible correct drift and carry out high precision processing.

When it is possible to use a material having a quality contrast difference of at least a few percent with respect to the material to be processed in a secondary electron image, as the drift correction marker, it is possible to easily detect the position of a formed film, even if it is a thin film, from this quality contrast difference. If the film is thin, there is the advantage that it is possible to form a drift correction marker in a short time. After forming a marker of a material having a quality contrast difference, drift correction and high precision processing are carried out by repeating interruption of processing, projection position detection, calculation of drift amount from comparison with stored projection position, microscopic adjustment of a processing region that has had drift altered, and restarting of processing, in the same sequence as previously described.

Figure 3:
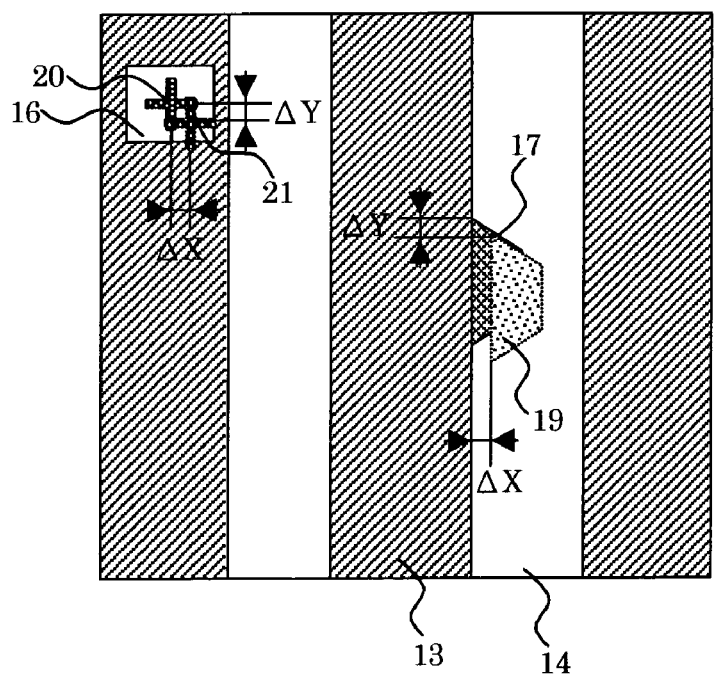
FIG. 3 is an explanatory view of the present invention showing a case where drift is corrected using pattern matching.

With respect to the defect correction described above, instead of forming the microscopic, projection 15 as shown in FIG. 1, a characteristic pattern 20 that can measure displacement in the X direction and the Y direction, such as a cross shape, is formed as shown in FIG. 3 on a light shielding film pattern 13 by electron beam CVD before start of processing, and during processing a characteristic pattern 21 is observed form a secondary electron image of a region 16 containing the pattern. Drift amounts $\Delta X$ and $\Delta Y$ are detected using pattern matching of a captured image and a previous image, processing is restarted using an irradiation region 19 created by adding offsets of drift amounts $\Delta X$ and $\Delta Y$ to the electron beam irradiation region 17 at the time of processing, and drift correction and high precision processing can be carried out by repeating pattern detection, calculation of drift amount from pattern matching, microscopic adjustment of a processing region that has had drift altered, and restarting of processing.

In the present invention described above, since a microscopic reference pattern formed by electron beam CVD is used in drift correction, it is possible to correct drift to high precision in an electron beam processing device, and it is possible to carry out high accuracy processing even with processing that takes a long time. Also, since processing uses an electron beam, it is possible to carry out high quality processing with reduced damage to a processed region and to a drift correction scanning region. Further, if a microscopic projection and a material that has a quality contrast difference to the material quality to be processed, in a secondary electron image, are used, there is the effect that the reference pattern can be detected with high resolution. Naturally, the present invention can be applied to other electron beam processing devices as well as a photomask repair device.

What is claimed is:

1. An electron beam processing method comprising the steps of:
    forming, in advance, a reference pattern by electron beam CVD while source material gas flows to the vicinity of a region to be processed before processing with an electron beam;
    acquiring a secondary electron image of a region including the reference pattern before and during processing of the region to calculate an amount of movement in the X direction and the Y direction of a position of the reference pattern; and
    carrying out processing on the region while correcting an irradiation position of the electron beam in the X direction and the Y direction based on the calculated amount of movement of the position of the reference pattern.

2. An electron beam processing method according to claim 1; wherein the reference pattern is a minute projection having a size of at least 20 nm.

3. An electron beam processing method according to claim 1; wherein the reference pattern is formed of a material having a contrast difference of a few percent or more from a substrate in a secondary electron image.

4. An electron beam processing method according to claim 1; wherein the reference pattern is a characteristic pattern whose displacement in an X direction and a Y direction can be measured; and the acquiring step includes calculating the amount of displacement of the characteristic pattern using pattern matching.

5. A method of correcting an irradiation position of an electron beam, comprising the steps of:
   forming a reference marker by electron beam CVD in the vicinity of a region of a sample to be processed with an electron beam;
   acquiring secondary electron images of a sample region that includes the reference marker before and during processing of the sample region with an electron beam;
   calculating from the secondary electron images an amount of drift in X and Y directions of the position of the reference marker; and
   carrying out processing on the sample region while correcting an irradiation position of the electron beam in the X and Y directions based on the calculated amount of drift of the position of the reference marker.

6. A method according to claim 5; wherein the acquiring step includes acquiring secondary electron images of a sample region that includes the reference marker a plurality of times during processing of the sample region with an electron beam; and the calculating and carrying out steps are carried out a plurality of times.

7. A method according to claim 5; wherein the reference marker comprises a projection.

8. A method according to claim 7; wherein the projection has a size of at least 20 nm.

9. A method according to claim 5; wherein the reference marker is formed of a material that produces a secondary electron image having a contrast difference of a few percent or more relative to the secondary electron image produced by the material being processed.

10. A method according to claim 5; wherein the reference marker comprises a characteristic pattern whose displacement in X and Y directions can be measured; and the calculating step comprises calculating the amount of displacement of the characteristic pattern using pattern matching.

11. A method according to claim 10; wherein the characteristic pattern has intersecting portions.

12. A method according to claim 11; wherein the characteristic pattern has a cross shape.

* * * * *